US011923212B2

(12) United States Patent
Shin et al.

(10) Patent No.: US 11,923,212 B2
(45) Date of Patent: Mar. 5, 2024

(54) APPARATUS AND METHOD FOR TREATING SUBSTRATE

(71) Applicant: SEMES CO., LTD., Cheonan-si (KR)

(72) Inventors: Kyungsik Shin, Asan-si (KR); Junho Kim, Yongin-si (KR); Jinki Shin, Busan (KR)

(73) Assignee: Semes Co., Ltd., Cheonan-si (KR)

( * ) Notice: Subject to any disclaimer, the term of this patent is extended or adjusted under 35 U.S.C. 154(b) by 150 days.

(21) Appl. No.: 17/072,501

(22) Filed: Oct. 16, 2020

(65) Prior Publication Data

US 2021/0118708 A1    Apr. 22, 2021

(30) Foreign Application Priority Data

Oct. 17, 2019    (KR) .................. 10-2019-0129221

(51) Int. Cl.
| | |
|---|---|
| H01L 21/67 | (2006.01) |
| F27B 17/00 | (2006.01) |
| F27D 5/00 | (2006.01) |
| G03F 7/16 | (2006.01) |
| H01L 21/027 | (2006.01) |
| H01L 21/3105 | (2006.01) |

(Continued)

(52) U.S. Cl.
CPC .... *H01L 21/67109* (2013.01); *F27B 17/0025* (2013.01); *F27B 17/0083* (2013.01); *F27D 5/0037* (2013.01); *G03F 7/162* (2013.01); *G03F 7/168* (2013.01); *H01L 21/0273* (2013.01); *H01L 21/31058* (2013.01); *H01L 21/67253* (2013.01); *H01L 22/26* (2013.01); *H05B 3/22* (2013.01)

(58) Field of Classification Search
None
See application file for complete search history.

(56) References Cited

U.S. PATENT DOCUMENTS

| | | | |
|---|---|---|---|
| 2002/0076659 A1* | 6/2002 | Shinya | H01L 21/67253 430/324 |
| 2003/0041971 A1 | 3/2003 | Kido et al. | |
| 2003/0166305 A1 | 9/2003 | Shinya et al. | |

(Continued)

FOREIGN PATENT DOCUMENTS

| | | |
|---|---|---|
| CN | 101145502 A | 3/2008 |
| CN | 104805416 A | 7/2015 |

(Continued)

OTHER PUBLICATIONS

Halbleiter (Year: 2010).*

(Continued)

*Primary Examiner* — Michael G Hoang
*Assistant Examiner* — Kurt J Wolford
(74) *Attorney, Agent, or Firm* — Harness, Dickey & Pierce, P.L.C.

(57) ABSTRACT

An apparatus for treating a substrate includes a process chamber having a process space inside, a support unit that supports the substrate in the process space, a heating unit that is provided inside the support unit and that heats the substrate, an exhaust unit that evacuates the process space, and a gas supply unit that supplies a gas into the process space, and the gas supply unit supplies the gas at a temperature selected from a first temperature and a second temperature.

7 Claims, 10 Drawing Sheets

(51) Int. Cl.
H01L 21/66 (2006.01)
H05B 3/22 (2006.01)

(56) References Cited

U.S. PATENT DOCUMENTS

| | | | | |
|---|---|---|---|---|
| 2018/0021804 | A1* | 1/2018 | Hashimoto | G03F 7/162 |
| | | | | 427/425 |
| 2018/0155830 | A1* | 6/2018 | Suzuki | C23C 16/4412 |
| 2019/0244790 | A1* | 8/2019 | Kamakura | C23C 16/45542 |

FOREIGN PATENT DOCUMENTS

| | | | |
|---|---|---|---|
| CN | 106206361 A | | 12/2016 |
| CN | 107706130 A | | 2/2018 |
| CN | 108022868 A | | 5/2018 |
| CN | 108075107 A | | 5/2018 |
| CN | 108981592 A | | 12/2018 |
| CN | 110120331 A | | 8/2019 |
| JP | H5166712 A | | 7/1993 |
| JP | H07-153749 A | | 6/1995 |
| JP | H10-284382 A | | 10/1998 |
| JP | H11-329927 A | | 11/1999 |
| JP | 2000-058430 A | | 2/2000 |
| JP | 2002-184682 A | | 6/2002 |
| JP | 2003-158054 A | | 5/2003 |
| JP | 2003-257848 A | | 9/2003 |
| JP | 2006-183934 A | | 7/2006 |
| JP | 2008-172111 A | | 7/2008 |
| JP | 2008-218593 A | | 9/2008 |
| JP | 2011-124342 A | | 6/2011 |
| KR | 10-2003-0019896 A | | 3/2003 |
| KR | 10-2006-0019300 A | | 3/2006 |
| KR | 10-0724188 B1 | | 5/2007 |
| KR | 10-2007-0107042 A | | 11/2007 |
| KR | 10-2008-0059120 A | | 6/2008 |
| KR | 10-2009-0011067 A | | 2/2009 |
| KR | 100887378 B1 | | 3/2009 |
| KR | 10-2009-0088808 A | | 8/2009 |
| KR | 10-2011-0094242 A | | 8/2011 |
| KR | 2015114049 A | * | 10/2015 |
| KR | 20160134926 A | * | 11/2016 |
| KR | 10-2018-0049312 A | | 5/2018 |
| KR | 10-2018-0070225 A | | 6/2018 |
| KR | 10-2018-0118316 A | | 10/2018 |
| KR | 102000026 B1 | | 7/2019 |
| TW | 201539625 A | | 10/2015 |
| WO | WO-2013-132881 A1 | | 9/2013 |

OTHER PUBLICATIONS

Halbleiter Accessibility Date (Year: 2022).*
Office Action dated Oct. 24, 2023 in Chinese Application No. 202011119329.1.

* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2019-0129221 filed on Oct. 17, 2019, in the Korean Intellectual Property Office, the entire contents of which are hereby incorporated by reference.

BACKGROUND

Embodiments of the inventive concept described herein relate to an apparatus and method for treating a substrate.

Various processes, such as cleaning, deposition, coating, photolithography, etching, ion implantation, and the like, are performed to manufacture semiconductor devices. Among these processes, the deposition process and the coating process are used as a process of forming a film on a substrate. In general, the deposition process is a process of forming a film by depositing a process gas on a substrate, and the coating process is a process of forming a liquid film by applying a treatment liquid to a substrate.

A bake process is performed on a substrate before and after a film is formed on the substrate. The bake process is a process of heating the substrate to a process temperature or more in a closed space. In the bake process, the entire region of the substrate is uniformly heated, or temperatures of respective regions of the substrate are adjusted depending on operators.

FIG. 1 is a sectional perspective view illustrating a general bake process apparatus. Referring to FIG. 1, a plurality of inlet tubes 2 are located in an upper wall of the bake process apparatus, and external gases are introduced into a buffer space 4 through the inlet tubes 2. The gases introduced into the buffer space 4 are distributed through dispensing holes 8 of a buffer plate 6 and are supplied to a substrate.

In a process in which the gases are supplied into a process space in the bake process apparatus, the thickness of a film formed on the substrate may not be uniformly formed, or the thickness of a film formed on the substrate before the substrate is placed in the bake process apparatus may not be uniformly formed. In particular, it may be difficult to adjust the thickness of a film formed on a central region of the substrate.

SUMMARY

Embodiments of the inventive concept provide a substrate treating apparatus and method for adjusting the thickness of a liquid film formed on a central region of a substrate.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate includes a process chamber having a process space inside, a support unit that supports the substrate in the process space, a heating unit that is provided inside the support unit and that heats the substrate, an exhaust unit that evacuates the process space, and a gas supply unit that supplies a gas into the process space, and the gas supply unit supplies the gas at a temperature selected from a first temperature and a second temperature.

According to an embodiment, the gas supply unit may include a first supply unit that supplies the gas at the first temperature into the process space and a second supply unit that supplies the gas at the second temperature higher than the first temperature into the process space.

According to an embodiment, the second supply unit may include a buffer space disposed over the support unit, a dispensing space to which the gas is delivered from the buffer space, a heater provided between the buffer space and the dispensing space, and a second supply tube that supplies the gas into the buffer space.

According to an embodiment, the first supply unit may include a first supply tube that directly supplies the gas into the process space.

According to an embodiment, the first supply unit may pass through the buffer space and the dispensing space.

According to an embodiment, the second supply unit further may include a partitioning plate that partitions an interior space of the second supply unit into the buffer space and the dispensing space and that has a first hole formed therein and a dispensing plate having a second hole formed therein for dispensing the gas in the dispensing space into the process space. The partitioning plate may face a central region of the substrate, and the dispensing plate may face an entire region of the substrate.

According to an embodiment, dispensing openings of the first supply unit and the second supply unit may face a central region of the substrate.

The gas supply unit may include a measurement device that measures a thickness of a liquid film formed on the substrate and a controller that receives the thickness of the liquid film on the substrate that is measured by the measurement device, in which the controller controls the gas supply unit.

According to an embodiment, based on the thickness of the liquid film on the substrate that is measured by the measurement device, the controller may supply the gas at the second temperature when the thickness of the liquid film formed on a central region of the substrate is greater than or equal to a predetermined value and may supply the gas at the first temperature when the thickness of the liquid film formed on the central region of the substrate is smaller than the predetermined value. The controller may control the gas supply unit to continually supply the gas until the thickness of the liquid film formed on the central region of the substrate reaches the predetermined value.

According to an embodiment, based on the thickness of the liquid film on the substrate that is measured by the measurement device, the controller may supply the gas at the second temperature when the thickness of the liquid film formed on a central region of the substrate is greater than or equal to a predetermined value. The controller may control the gas supply unit to increase a flow rate of the gas as the thickness of the liquid film formed on the central region of the substrate is increased and to continually supply the gas until the thickness of the liquid film formed on the central region of the substrate reaches the predetermined value.

According to an embodiment, based on the thickness of the liquid film on the substrate that is measured by the measurement device, the controller may supply the gas at the first temperature when the thickness of the liquid film formed on a central region of the substrate is smaller than a predetermined value. The controller may control the gas supply unit to increase a flow rate of the gas as the thickness of the liquid film formed on the central region of the substrate is decreased and to continually supply the gas until the thickness of the liquid film formed on the central region of the substrate reaches the predetermined value.

According to an exemplary embodiment, a method for treating a substrate includes controlling a temperature or a flow rate of the gas supplied into the process space, so as to allow a thickness of a liquid film formed on a central region of the substrate to reach a predetermined thickness.

According to an embodiment, the second supply unit may include a buffer space disposed over the support unit, a dispensing space to which the gas is delivered from the buffer space, a heater provided between the buffer space and the dispensing space, and a second supply tube that supplies the gas into the buffer space.

According to an embodiment, the first supply unit may include a first supply tube that directly supplies the gas into the process space.

According to an embodiment, the gas at the first temperature may be supplied into the process space facing the central region of the substrate.

According to an embodiment, the gas at the second temperature may be supplied when the thickness of the liquid film formed on the central region of the substrate is greater than or equal to a predetermined value. The gas at the first temperature may be supplied when the thickness of the liquid film formed on the central region of the substrate is smaller than the predetermined value. The gas may be continually supplied until the thickness of the liquid film formed on the central region of the substrate reaches the predetermined value.

According to an embodiment, the gas at the second temperature may be supplied when the thickness of the liquid film formed on the central region of the substrate is greater than or equal to a predetermined value. The flow rate of the gas may be increased as the thickness of the liquid film formed on the central region of the substrate is increased. The gas may be continually supplied until the thickness of the liquid film formed on the central region of the substrate reaches the predetermined value.

According to an embodiment, the gas at the first temperature may be supplied when the thickness of the liquid film formed on the central region of the substrate is smaller than a predetermined value. The flow rate of the gas may be increased as the thickness of the liquid film formed on the central region of the substrate is decreased. The gas may be continually supplied until the thickness of the liquid film formed on the central region of the substrate reaches the predetermined value.

According to an exemplary embodiment, a method for treating a substrate includes performing a heat treatment process of evaporating a solvent from a liquid film of photoresist by heating the substrate having the liquid film thereon in a process space. The heat treatment process may include heating the substrate with a heater in a state in which a gas is supplied into the process space and changing a temperature or a flow rate of the gas supplied into the process space while the substrate is subjected to heat treatment.

According to an embodiment, the temperature of the gas supplied into the process space may be raised when the liquid film formed on a central region of the substrate has a thickness greater than or equal to a predetermined value. The temperature of the gas supplied into the process space may be lowered when the liquid film formed on the central region of the substrate has a thickness smaller than the predetermined value. The gas may be continually supplied until the thickness of the liquid film formed on the central region of the substrate reaches the predetermined value.

According to an embodiment, the flow rate of the gas supplied into the process space may be increased with an increase in a degree to which the thickness of the liquid film formed on the central region of the substrate deviates from the predetermined value, and the gas may be continually supplied until the thickness of the liquid film formed on the central region of the substrate reaches the predetermined value.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
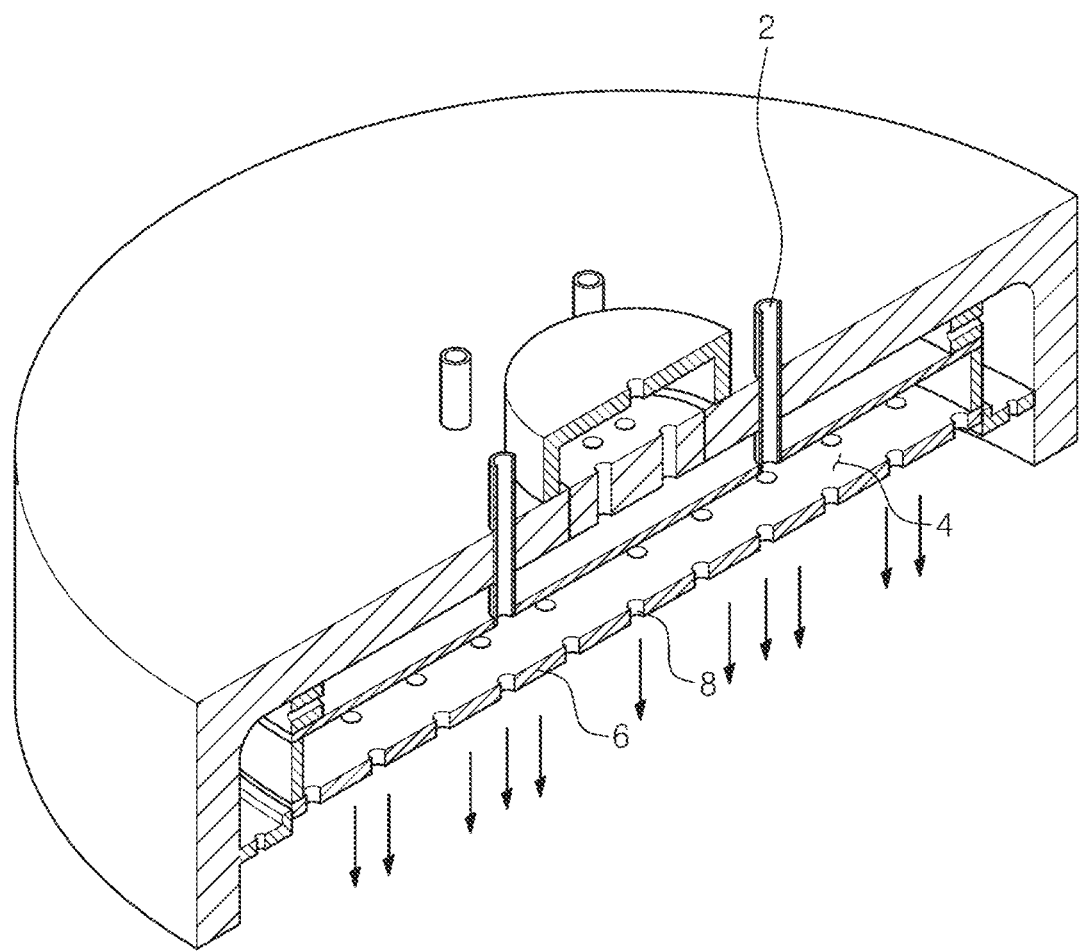
FIG. 1 is a sectional perspective view illustrating a general bake process apparatus.

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that the inventive concept will be thorough and complete, and will fully convey the scope of the inventive concept to those skilled in the art. In the drawings, the dimensions of components are exaggerated for clarity of illustration.

Figure 2:
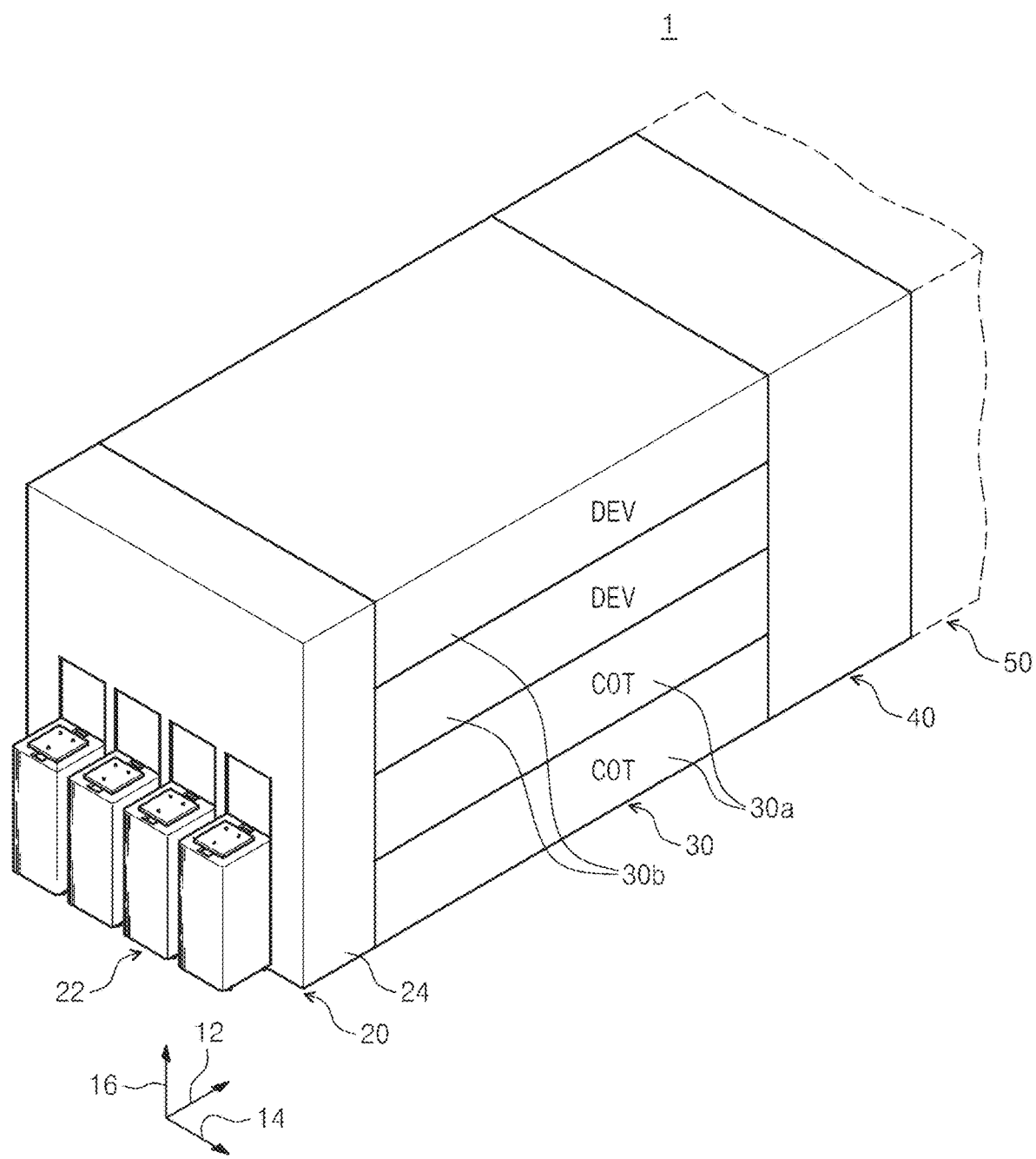
FIG. 2 is a schematic perspective view illustrating a substrate treating apparatus according to an embodiment of the inventive concept.
Figure 3:
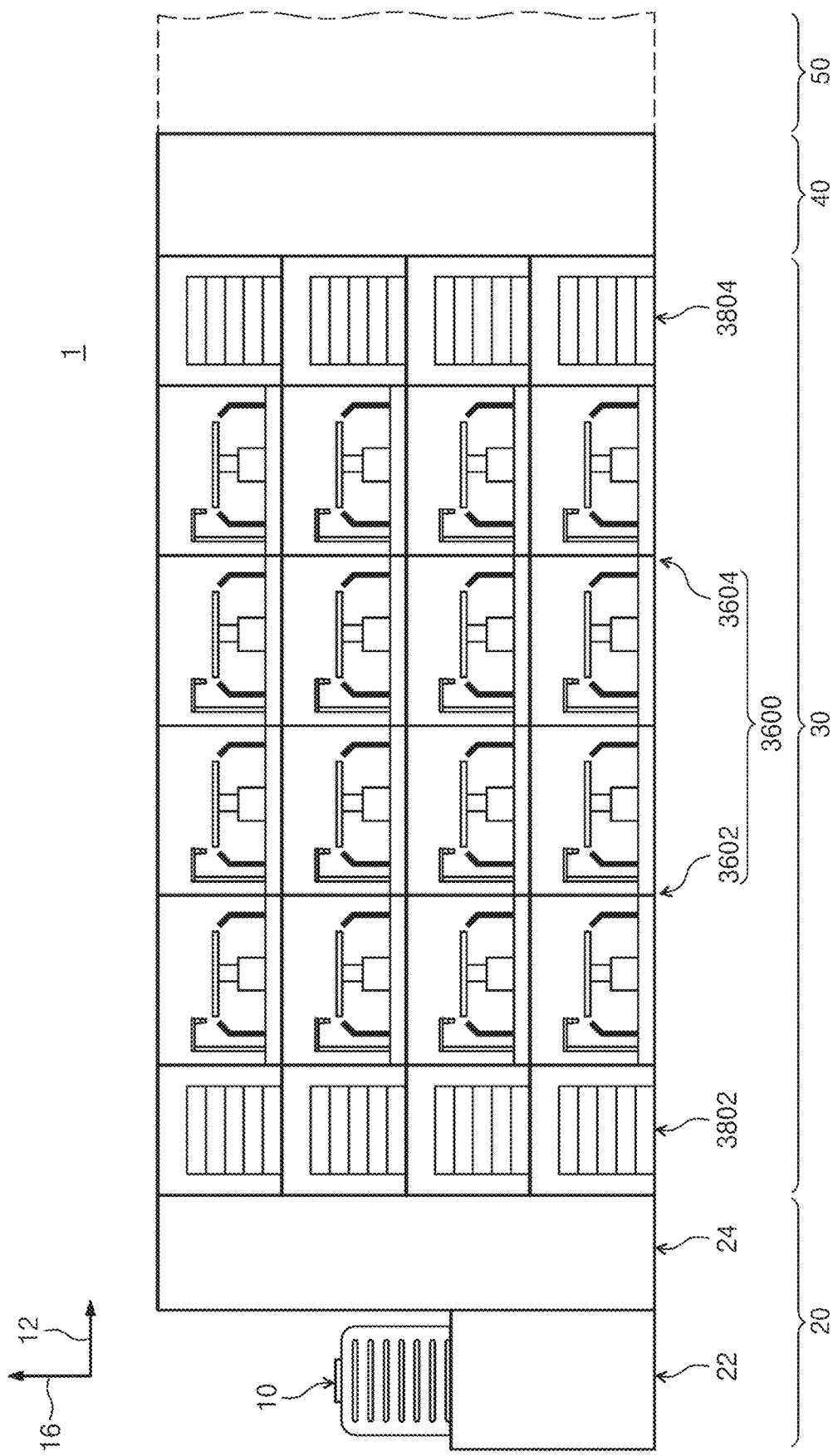
FIG. 3 is a sectional view illustrating coating blocks and developing blocks of the substrate treating apparatus of FIG. 2.
Figure 4:
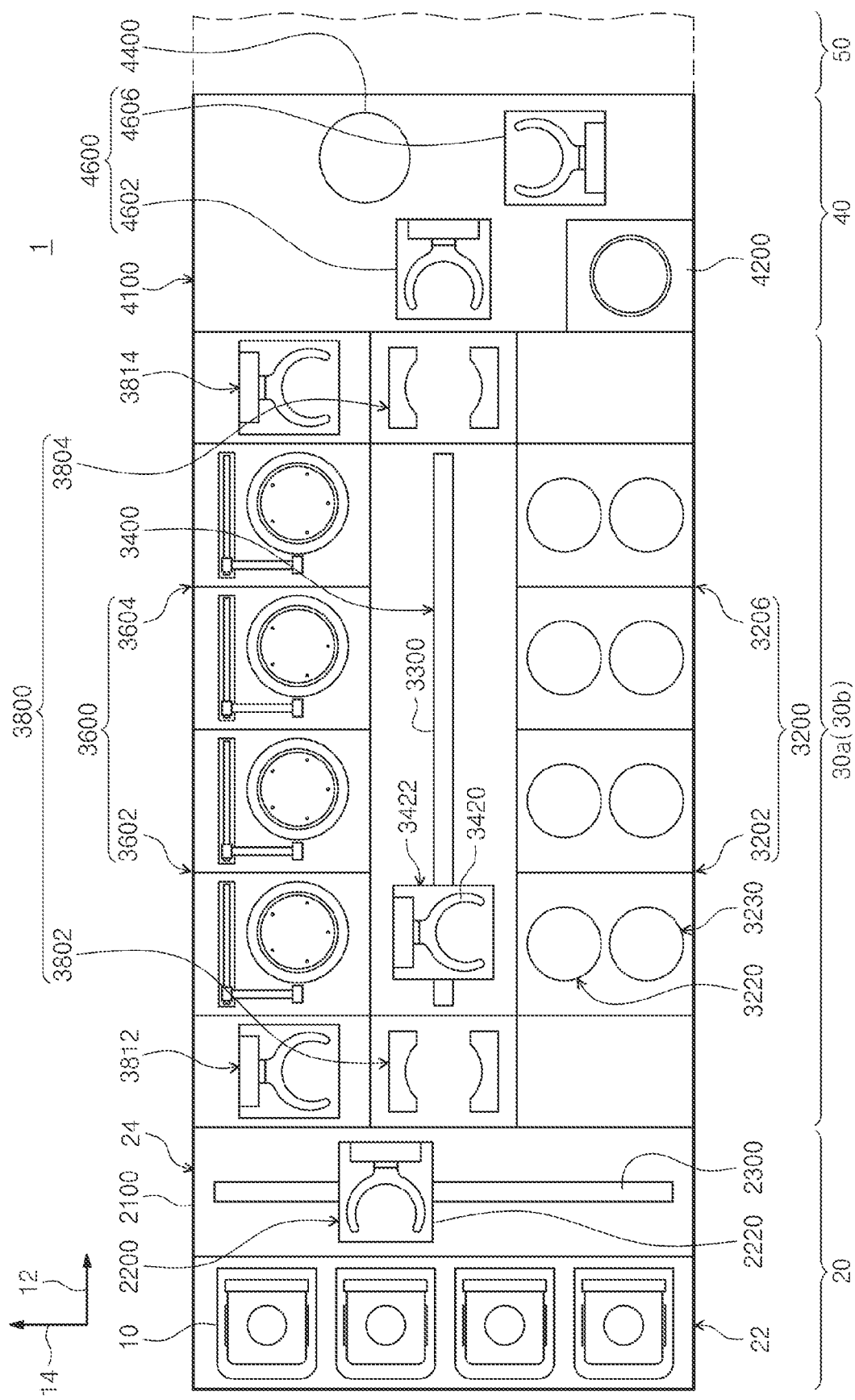
FIG. 4 is a plan view illustrating the substrate treating apparatus of FIG. 2.

FIG. 2 is a schematic perspective view illustrating a substrate treating apparatus according to an embodiment of the inventive concept. FIG. 3 is a sectional view illustrating coating blocks and developing blocks of the substrate treating apparatus of FIG. 2. FIG. 4 is a plan view illustrating the substrate treating apparatus of FIG. 2.

Referring to FIGS. 2 to 4, the substrate treating apparatus 1 includes an index module 20, a treating module 30, and an interface module 40. According to an embodiment, the index module 20, the treating module 30, and the interface module 40 are sequentially disposed in a row. Hereinafter, a direction in which the index module 20, the treating module 30, and the interface module 40 are arranged is referred to as a first direction 12, a direction perpendicular to the first direction 12 when viewed from above is referred to as a second direction 14, and a direction perpendicular to both the first direction 12 and the second direction 14 is referred to as a third direction 16.

The index module 20 transfers substrates W from carriers 10 having the substrates W received therein to the treating module 30 and places the completely treated substrates W in the carriers 10. The lengthwise direction of the index module 20 is parallel to the second direction 14. The index module 20 has load ports 22 and an index frame 24. The load ports 22 are located on the opposite side to the treating module 30 with respect to the index frame 24. The carriers 10, each of which has the substrates W received therein, are placed on the load ports 22. The load ports 22 may be disposed along the second direction 14.

Airtight carriers 10 such as front open unified pods (FOUPs) may be used as the carriers 10. The carriers 10 may be placed on the load ports 22 by a transfer unit (not illustrated) such as an overhead transfer, an overhead conveyor, or an automatic guided vehicle, or by an operator.

An index robot 2200 is provided in the index frame 24. A guide rail 2300, the lengthwise direction of which is parallel to the second direction 14, is provided in the index frame 24, and the index robot 2200 is movable on the guide rail 2300. The index robot 2200 includes hands 2220 on which the substrates W are placed. The hands 2220 are movable forward and backward, rotatable about an axis facing in the third direction 16, and movable along the third direction 16.

The treating module 30 performs a coating process and a developing process on the substrates W. The treating module 30 has the coating blocks 30*a* and the developing blocks 30*b*. The coating blocks 30*a* perform the coating process on the substrates W, and the developing blocks 30*b* perform the developing process on the substrates W. The coating blocks 30*a* are stacked on each other. The developing blocks 30*b* are stacked on each other. According to the embodiment of FIG. 2, two coating blocks 30*a* and two developing blocks 30*b* are provided. The coating blocks 30*a* may be disposed under the developing blocks 30*b*. According to an embodiment, the two coating blocks 30*a* may perform the same process and may have the same structure. Furthermore, the two developing blocks 30*b* may perform the same process and may have the same structure.

Referring to FIG. 4, each of the coating blocks 30*a* has heat treatment chambers 3200, a transfer chamber 3400, liquid treatment chambers 3600, and buffer chambers 3800. Each of the heat treatment chambers 3200 performs a heat treatment process on the substrate W. The heat treatment process may include a cooling process and a heating process. Each of the liquid treatment chambers 3600 forms a liquid film on the substrate W by dispensing a liquid onto the substrate W. The liquid film may be a photoresist film or an anti-reflection film. The transfer chamber 3400 transfers the substrate W between the heat treatment chamber 3200 and the liquid treatment chamber 3600 in the coating block 30*a*.

The transfer chamber 3400 is disposed such that the lengthwise direction thereof is parallel to the first direction 12. A transfer robot 3422 is provided in the transfer chamber 3400. The transfer robot 3422 transfers the substrate W between the heat treatment chamber 3200, the liquid treatment chamber 3600, and the buffer chambers 3800. According to an embodiment, the transfer robot 3422 has a hand 3420 on which the substrate W is placed, and the hand 3420 is movable forward and backward, rotatable about an axis facing in the third direction 16, and movable along the third direction 16. A guide rail 3300, the lengthwise direction of which is parallel to the first direction 12, is provided in the transfer chamber 3400, and the transfer robot 3422 is movable on the guide rail 3300.

The heat treatment chambers 3200 are arranged along the first direction 12. The heat treatment chambers 3200 are located on one side of the transfer chamber 3400.

Each of the heat treatment chambers 3200 performs heat treatment on the substrate W. The heat treatment chamber 3200 performs heat treatment on the substrate W before and after the substrate W is coated with a photosensitive liquid. To change the property of a surface of the substrate W before the substrate W is coated with the photosensitive liquid, the heat treatment chamber 3200 may heat the substrate W to a predetermined temperature and may form a treatment liquid film, such as an adhesive, on the substrate W. After the substrate W is coated with the photosensitive liquid, the heat treatment chamber 3200 may perform heat treatment on the photosensitive liquid film on the substrate W in a pressure reduced atmosphere. The heat treatment chamber 3200 may volatilize a volatile material contained in the photosensitive liquid film. In this embodiment, the heat treatment chamber 3200 is described as a unit for performing heat treatment on the photosensitive liquid film.

The heat treatment chamber 3200 includes a cooling unit 3220 and a heating unit 3230. The cooling unit 3220 cools the substrate W heated by the heating unit 3230. The cooling unit 3220 has a circular plate shape. A cooling means, such as cooling water or a thermoelectric element, is provided inside the cooling unit 3220. For example, the substrate W placed on the cooling unit 3220 may be cooled to a temperature that is the same as, or close to, the room temperature.

Figure 5:
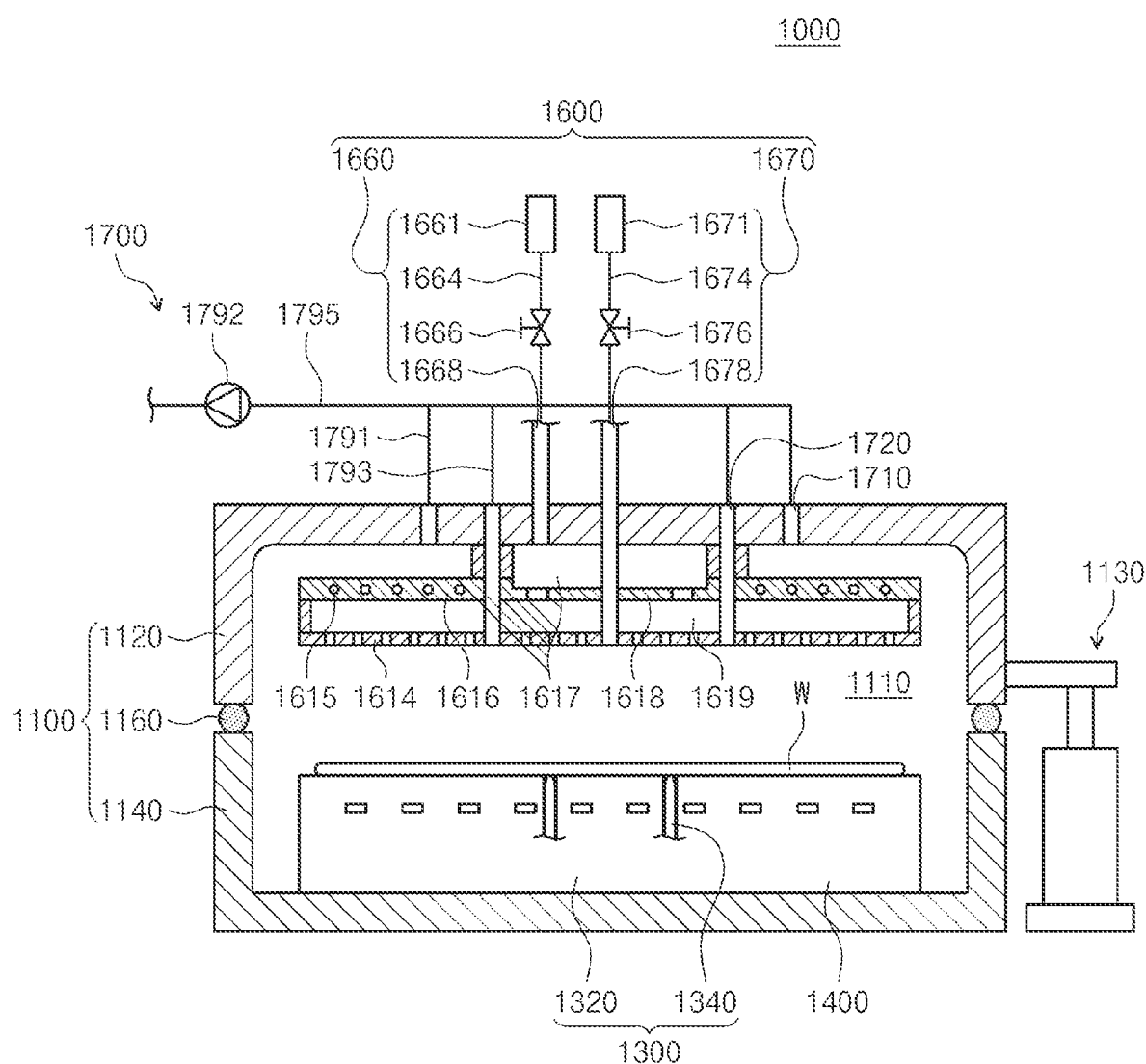
FIG. 5 is a sectional view illustrating a substrate treating apparatus according to an embodiment of the inventive concept.

FIG. 5 is a sectional view illustrating a substrate treating apparatus according to an embodiment of the inventive concept. Referring to FIG. 5, the heating unit 3230 is implemented with the substrate treating apparatus 1000 that heats the substrate W. The substrate treating apparatus 1000 heats the substrate W in an atmospheric atmosphere or in an atmosphere of reduced pressure lower than the atmospheric pressure.

Referring to FIG. 5, the substrate treating apparatus 1000 includes a housing 1100, a support unit 1300, a heating unit 1400, an exhaust unit 1700, and a gas supply unit 1600.

The housing 1100 has a process space 1110 therein in which the substrate W is heated. The process space 1110 is sealed from the outside. The housing 1100 includes an upper body 1120, a lower body 1140, and a sealing member 1160.

The upper body 1120 has a container shape that is open at the bottom. For example, the upper body 1120 may have a cylindrical shape. The upper body 1120 has an opening formed in an upper wall thereof. The opening may be formed in a region corresponding to the central axis of the upper body 1120.

The lower body 1140 has a container shape that is open at the top. For example, the lower body 1140 may have a cylindrical shape. The lower body 1140 is located under the upper body 1120. The upper body 1120 and the lower body 1140 are located to face each other in an up-down direction. The upper body 1120 and the lower body 1140 are combined with each other to form the process space 1110 inside. The upper body 1120 and the lower body 1140 are located such that the central axes thereof are aligned with each other with respect to the up-down direction. The lower body 1140 may have the same diameter as the upper body 1120. That is, an upper end of the lower body 1140 may be located to face a lower end of the upper body 1120.

One of the upper body 1120 and the lower body 1140 is moved to an open position or a closed position by a lifting member 1130, and the other is fixed in position. According to an embodiment, the position of the lower body 1140 may be fixed, and the upper body 1120 may be moved between the open position and the closed position by the lifting member 1130. Here, the open position is a position in which the upper body 1120 is spaced apart from the lower body 1140 and the process space 1110 is open. The closed position is a position in which the process space 1110 is sealed from the outside by the lower body 1140 and the upper body 1120.

The sealing member 1160 fills the gap between the upper body 1120 and the lower body 1140. The sealing member 1160 is located between the lower end of the upper body 1120 and the upper end of the lower body 1140. The sealing member 1160 may be an O-ring member 1160 having an annular ring shape. The sealing member 1160 may be fixedly coupled to the upper end of the lower body 1140.

Figure 6:
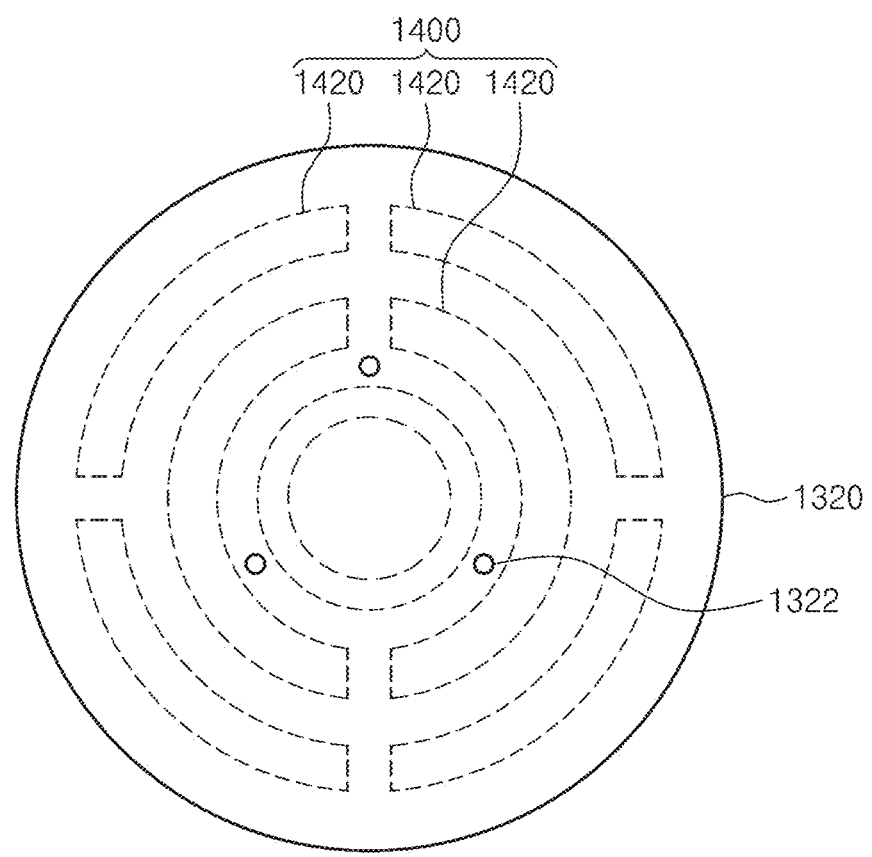
FIG. 6 is a plan view illustrating a heating unit and a support unit of FIG. 5.

FIG. 6 is a plan view illustrating the heating unit and the support unit of FIG. 5. Hereinafter, the heating unit 1400 and the support unit 1300 will be described with reference to FIG. 6. The support unit 1300 supports the substrate W in the process space 1110. The support unit 1300 is fixedly coupled to the lower body 1140. The support unit 1300 includes a seating plate 1320 and lift pins 1340. The seating plate 1320 supports the substrate W in the process space 1110. The seating plate 1320 has a circular plate shape. The substrate W is seated on an upper surface of the seating plate 1320. A central region of the upper surface of the seating plate 1320 functions as a seating surface on which the substrate W is seated.

The seating plate 1320 has a plurality of pin holes 1322 formed in the seating surface thereof. When viewed from above, the pin holes 1322 are arranged to surround the center of the seating surface. The pin holes 1322 are spaced apart from each other along the circumferential direction. The pin holes 1322 are circumferentially spaced apart from each other at the same intervals. The lift pins 1340 are located in the pin holes 1322, respectively. The lift pins 1340 are provided to move in the up-down direction. The lift pins 1340 raise the substrate W off the seating plate 1320, or lower the substrate W onto the seating plate 1320. For example, three pin holes 1322 may be provided.

The heating unit 1400 heats the substrate W seated on the seating plate 1320. The heating unit 1400 is located inside the seating plate 1320. The heating unit 1400 includes a plurality of heaters 1420. The heaters 1420 are located inside the seating plate 1320. The heaters 1420 are located on the same plane. The heaters 1420 heat different regions of the seating plate 1320. Regions of the seating plate 1320 that correspond to the respective heaters 1420 when viewed from above may be provided as heating zones. The temperatures of the respective heaters 1420 are independently adjustable. For example, 15 heating zones may be provided. The temperature of each of the heating zones is measured by a sensor (not illustrated). The heaters 1420 may be thermoelectric elements or heating wires. Selectively, the heaters 1420 may be mounted on a bottom surface of the seating plate 1320.

The exhaust unit 1700 evacuates an atmosphere in the process space 1110. The exhaust unit 1700 forcibly releases a gas introduced into the process space 1110 from the outside. The exhaust unit 1700 includes edge exhaust holes 1710, center exhaust holes 1720, edge exhaust lines 1791, center exhaust lines 1793, an integrated exhaust line 1795, and a pressure-reducing member 1792.

The edge exhaust holes 1710 and the edge exhaust lines 1791 evacuate the process space 1110 facing an edge region of the substrate W, and the center exhaust holes 1720 and the center exhaust lines 1793 evacuate the process space 1110 facing a central region of the substrate W. In an embodiment, the edge exhaust holes 1710 and the center exhaust holes 1720 may be arranged in a ring shape.

The edge exhaust lines 1791 and the center exhaust lines 1793 are connected to the integrated exhaust line 1795. The pressure-reducing member 1792 is connected to the integrated exhaust line 1795 and provides reduced pressure to evacuate the process space 1110.

The gas supply unit 1600 is located over the support unit 1300. The gas supply unit 1600 supplies a gas into the process space 1110. In an embodiment, the gas supply unit 1600 supplies the gas at a temperature selected from a first temperature and a second temperature. The fluid supply unit 1600 includes a first supply unit 1670 and a second supply unit 1660. The first supply unit 1670 supplies the gas at the first temperature into the process space 1110. The second supply unit 1660 supplies the gas at the second temperature higher than the first temperature into the process space 1110.

The second supply unit 1660 includes a gas supply source 1661, a gas supply line 1664, a second control valve 1666, a buffer space 1617, a partitioning plate 1618, a dispensing space 1619, a dispensing plate 1614, a heater 1615, and a second supply tube 1668. The buffer space 1617, the partitioning plate 1618, the dispensing space 1619, and the dispensing plate 1614 are sequentially disposed from top to bottom.

The gas supply line 1664 supplies the gas from the gas supply source 1661 to the buffer space 1617. The second control valve 1666 controls the flow rate of the gas supplied from the gas supply source 1661 to the buffer space 1617.

The buffer space 1617 and the dispensing space 1619 are disposed over the support unit 1300. In an embodiment, the buffer space 1617 and the dispensing space 1619 may be provided in a container shape. The partitioning plate 1618 partitions an interior space of the second supply unit 1660 into the buffer space 1617 and the dispensing space 1619. The partitioning plate 1618 is opposite the central region of the substrate W and faces the support unit 1300. The partitioning plate 1618 is spaced apart from the upper body 1120. The partitioning plate 1618 has first holes formed therein. The buffer space 1617 and the dispensing space 1619 are connected by the first holes. Accordingly, the gas is delivered from the buffer space 1617 to the dispensing space 1619.

The dispensing plate 1614 dispenses the gas in the dispensing space 1619 to the process space 1110. The dispensing plate 1614 is spaced apart from the partitioning plate 1618. The dispensing plate 1614 has second holes formed therein. The gas in the dispensing space 1619 is supplied into the process space 1110 through the second holes. In an embodiment, the dispensing plate 1614 faces the entire region of the substrate W. The partitioning plate 1618 and the dispensing plate 1614 have a circular plate shape, and lateral portions thereof are connected to the upper body 1120 and an upper plate 1616 including the heater 1615. The partitioning plate 1618 has a smaller diameter than the dispensing plate 1614. Accordingly, the buffer space 1617 is smaller than the dispensing space 1619.

The heater 1615 is provided inside the upper plate 1616. The upper plate 1616 is provided between the buffer space 1617 and the dispensing space 1619. The heater 1615 heats the gas that stays in the buffer space 1617. The second supply tube 1668 supplies the gas into the buffer space 1617.

The first supply unit 1670 includes a gas supply source 1671, a gas supply line 1674, a first control valve 1676, and a first supply tube 1678.

The gas supply line 1674 supplies the gas from the gas supply source 1671 to the process space 1110. The first control valve 1676 controls the flow rate of the gas supplied from the gas supply source 1671 to the process space 1110.

The first supply tube 1678 directly supplies the gas into the process space 1110. In an embodiment, the first supply unit 1670 passes through the buffer space 1617 and the dispensing space 1619.

The gas supplied into the buffer space 1617 through the second supply tube 1668 is heated by the heater 1615. In contrast, the gas supplied into the process space 1110 through the first supply tube 1678 does not pass through the buffer space 1617 and therefore has a lower temperature than the gas supplied into the buffer space 1617 through the second supply tube 1668.

Hereinafter, a substrate treating method of the inventive concept will be described with reference to FIGS. 7 and 8.

First, the substrate W having the photoresist film formed thereon is loaded into the process space 1110. The substrate treating apparatus 1000 performs a heat treatment process of evaporating a solvent from the liquid film by heating the loaded substrate W. The substrate W is heated by the heating unit 1400 inside the support unit 1300 in a state in which the gas supply unit 1600 supplies the gas into the process space 1110. The gas supply unit 1600 adjusts the thickness of the liquid film on the substrate W by changing the temperature or the flow rate of the gas supplied into the process space 1110 while the substrate W is subjected to heat treatment.

In an embodiment, dispensing openings of the first supply unit 1670 and the second supply unit 1660 are provided to face the central region of the substrate W, and the first supply unit 1670 and the second supply unit 1660 adjust the thickness of the liquid film formed on the central region of the substrate W.

The gas supply unit 1600 may further include a measurement device and a controller. The measurement device measures the thickness of the liquid film formed on the substrate W, and the controller receives the thickness of the liquid film on the substrate W that is measured by the measurement device, and controls the gas supply unit 1600.

Figure 7:
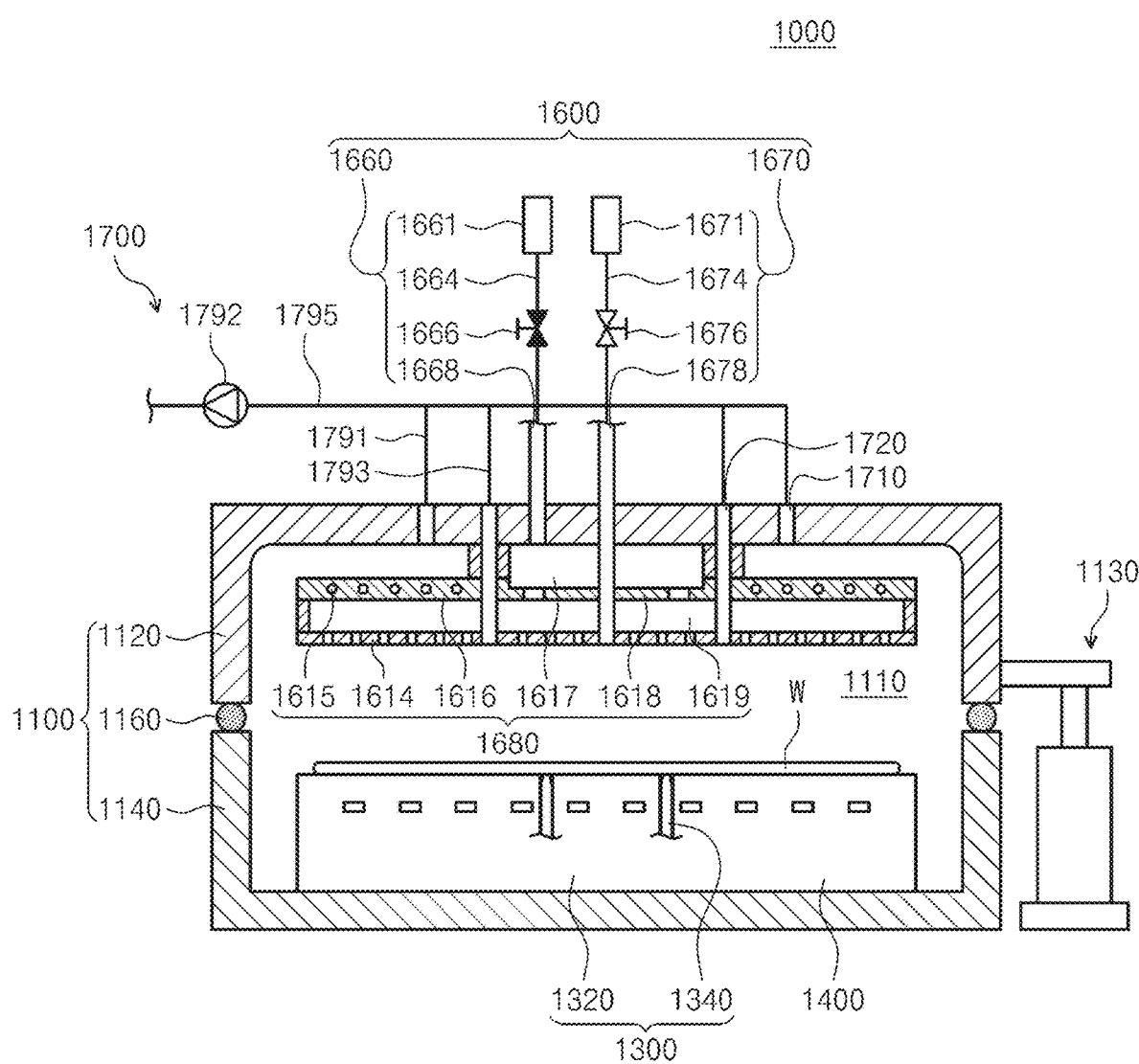
FIGS. 7 and 8 are views illustrating a substrate treating method of the inventive concept.

Based on the thickness of the liquid film on the substrate W that is measured by the measurement device, the second supply unit 1660, as illustrated in FIG. 7, supplies the gas at the second temperature when the thickness of the liquid film formed on the central region of the substrate W is greater than or equal to a predetermined value. The second supply unit 1660 continually supplies the gas at the second temperature until the thickness of the liquid film formed on the central region of the substrate W reaches the predetermined value.

The gas passing through the buffer space 1617 is delivered to the dispensing space 1619. At this time, high-temperature gas is intensively dispensed onto the central region of the substrate W because the buffer space 1617 faces the central region of the substrate W. The gas heated to a high temperature by the heater 1615 in the buffer space 1617 accelerates evaporation of the liquid film formed on the central region of the substrate W. The second supply unit 1660 continually supplies the gas at the second temperature until the thickness of the liquid film formed on the central region of the substrate W reaches the predetermined value.

Figure 8:
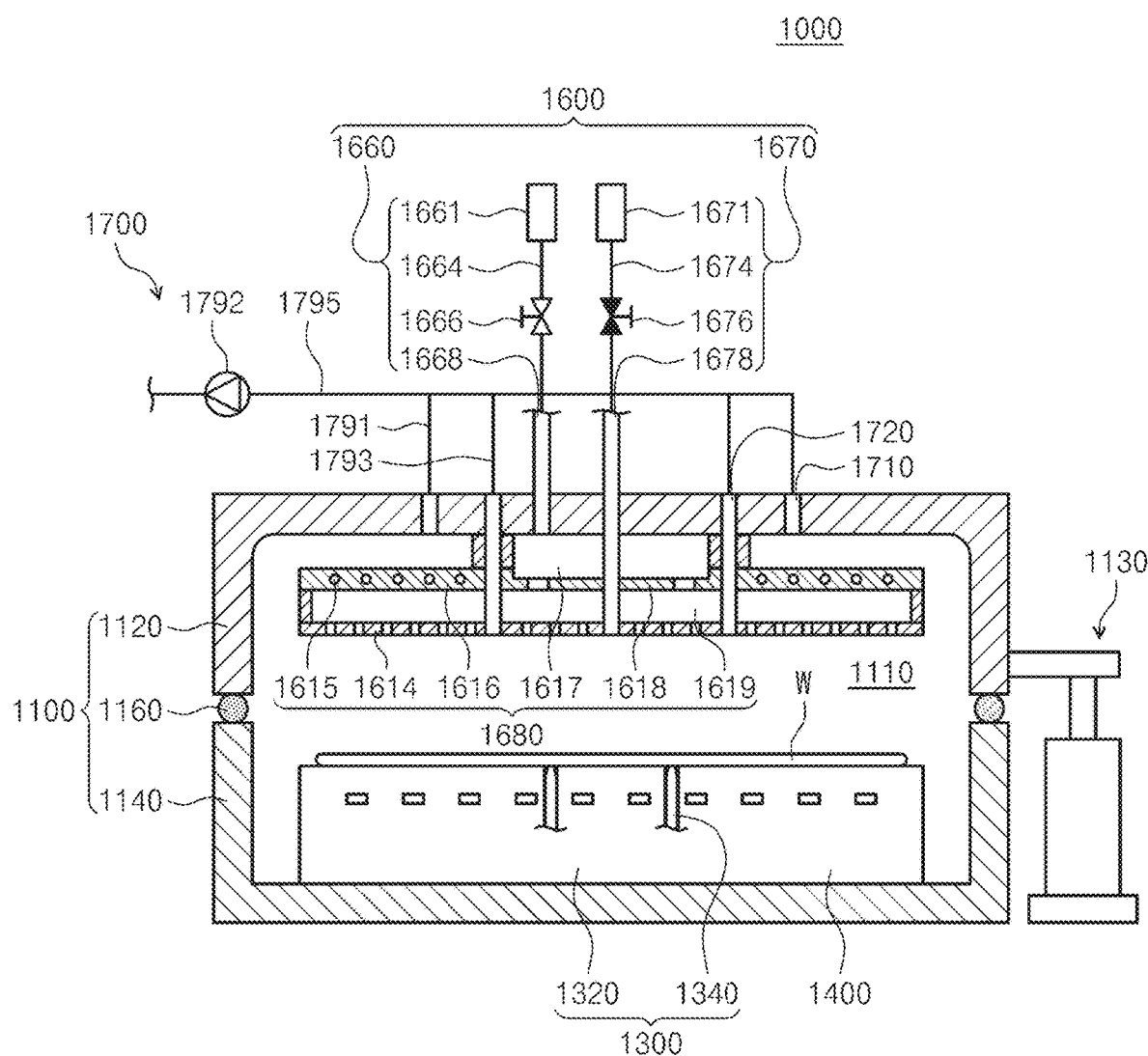

Based on the thickness of the liquid film on the substrate W that is measured by the measurement device, the first supply unit 1670, as illustrated in FIG. 8, supplies the gas at the first temperature when the thickness of the liquid film formed on the central region of the substrate W is smaller than the predetermined value. As the gas at a relatively low temperature is supplied to the central region of the substrate W, the liquid film formed on the central region of the substrate W is evaporated slower than the liquid film formed on the edge region of the substrate W, and thus the liquid film has a uniform thickness. The first supply unit 1670 continually supplies the gas at the first temperature until the thickness of the liquid film formed on the central region of the substrate W reaches the predetermined value.

As the thickness of the liquid film formed on the central region of the substrate W is increased, the flow rate of the gas may be increased, and until the thickness of the liquid film formed on the central region of the substrate W reaches the predetermined value, the gas may be continually supplied.

Figure 9:
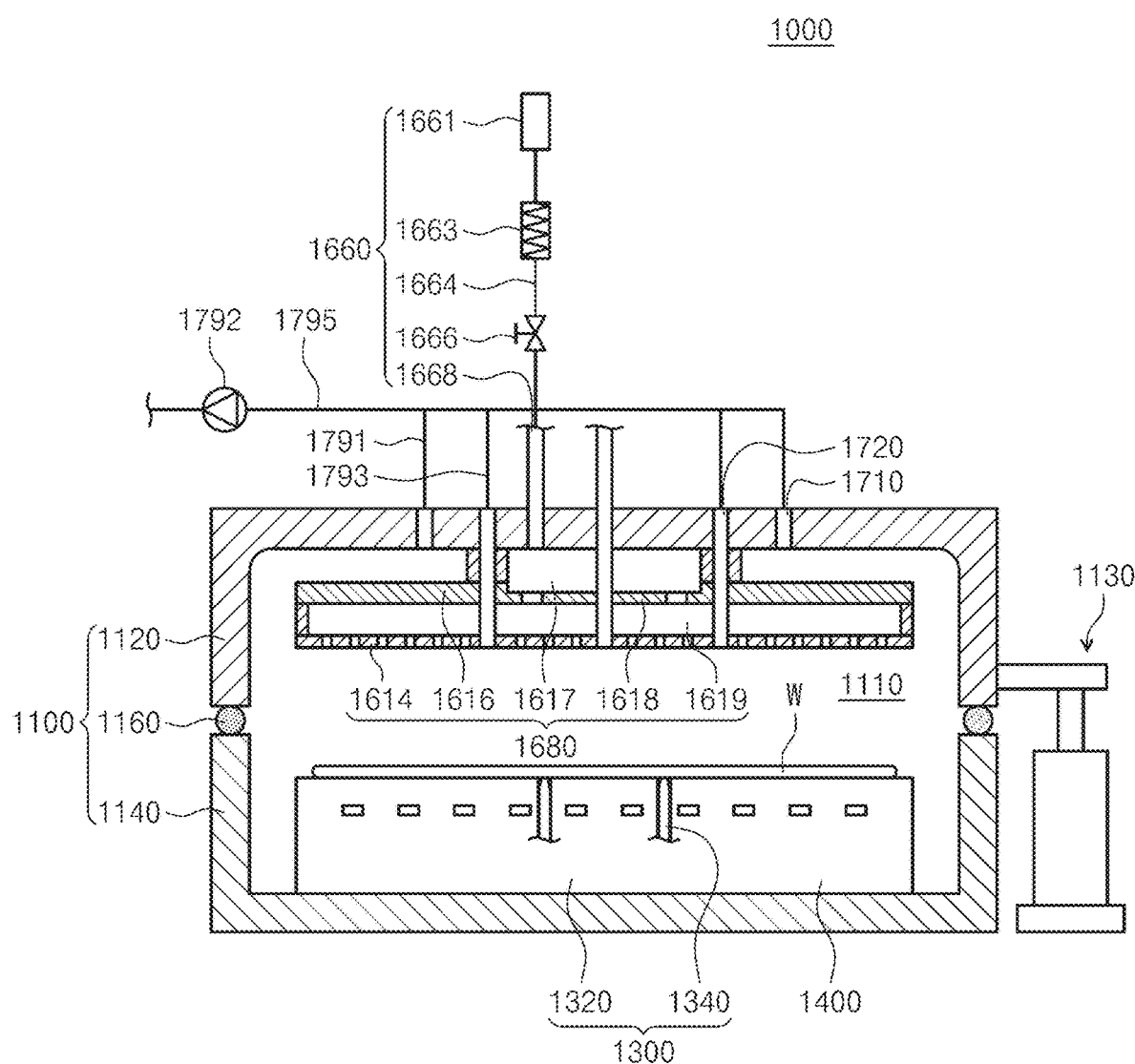
FIGS. 9 and 10 are sectional views illustrating substrate treating apparatuses according to other embodiments of the inventive concept.
Figure 10:
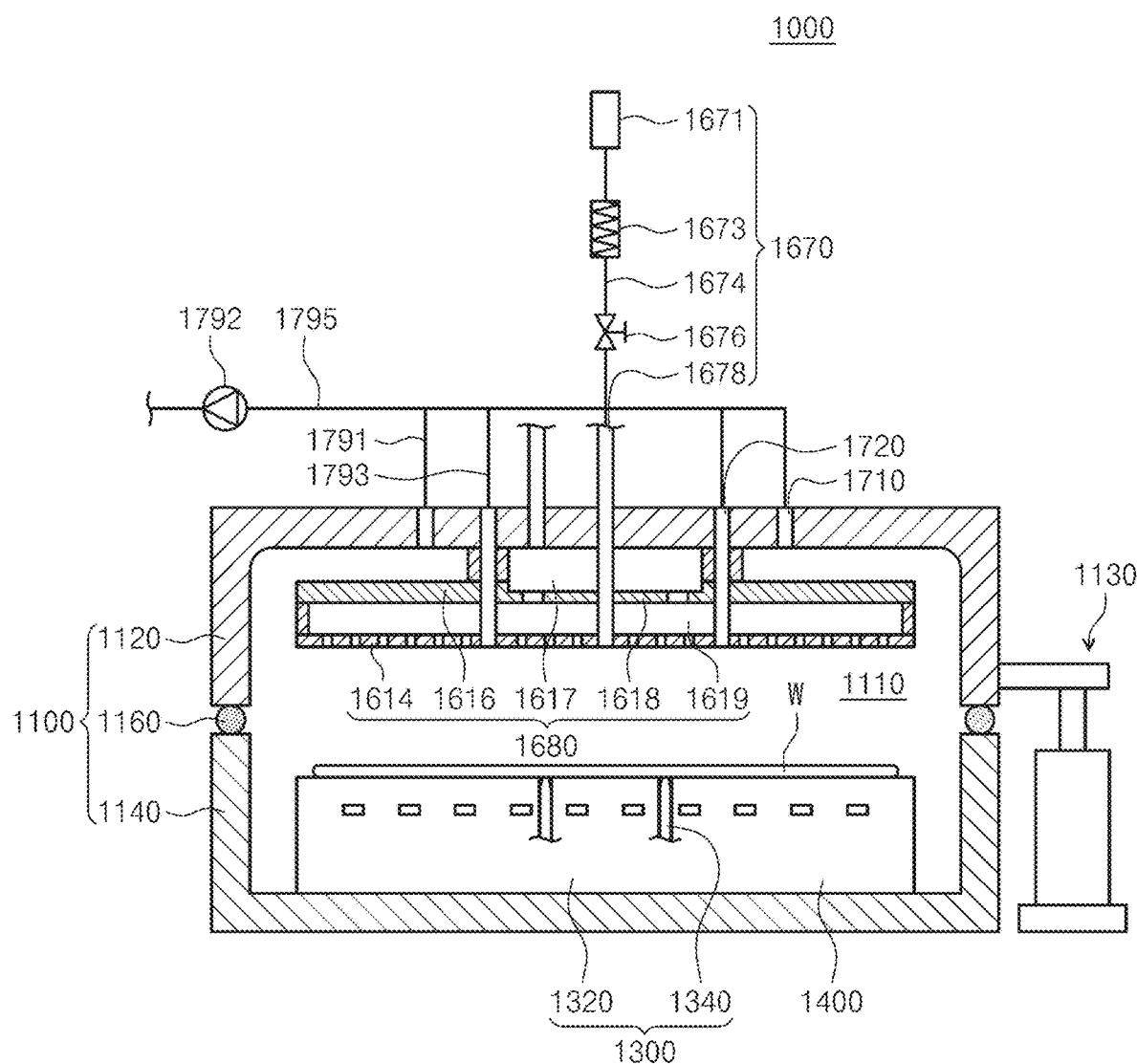

In the above-described embodiment, it has been exemplified that the first supply unit 1670 and the second supply unit 1660 supply the gas at the first temperature and the gas at the second temperature, respectively. However, as illustrated in FIGS. 9 and 10, the substrate treating apparatus 1000 may include only one of the first supply unit 1670 and the second supply unit 1660. In an embodiment, the first supply unit 1670 may further include a first heater 1673, and the second supply unit 1660 may further include a second heater 1663.

The first heater 1673 heats the gas that is supplied into the process space 1110 through the first supply unit 1670. The second heater 1663 heats the gas that is supplied into the buffer space 1617 through the second supply unit 1660. As the thickness of the liquid film formed on the central region of the substrate W is increased, the first heater 1673 and the second heater 1663 heats the gas to a higher temperature.

Referring again to FIGS. 3 and 4, the plurality of liquid treatment chambers 3600 are provided. Some of the liquid treatment chambers 3600 may be stacked on each other. The liquid treatment chambers 3600 are disposed on an opposite side of the transfer chamber 3400. The liquid treatment chambers 3600 are arranged side by side along the first direction 12. Some of the liquid treatment chambers 3600 are located adjacent to the index module 20. Hereinafter, these liquid treatment chambers are referred to as the front liquid treatment chambers 3602. Other liquid treatment chambers 3600 are located adjacent to the interface module 40. Hereinafter, these liquid treatment chambers are referred to as the rear liquid treatment chambers 3604.

Each of the front liquid treatment chambers 3602 applies a first liquid to the substrate W, and each of the rear liquid treatment chambers 3604 applies a second liquid to the substrate W. The first liquid and the second liquid may be different types of liquids. According to an embodiment, the first liquid is an anti-reflection film, and the second liquid is photoresist. The photoresist may be applied to the substrate W coated with the anti-reflection film. Selectively, the first liquid may be photoresist, and the second liquid may be an anti-reflection film. In this case, the anti-reflection film may be applied to the substrate W coated with the photoresist. Selectively, the first liquid and the second liquid may be of the same type. Both the first liquid and the second liquid may be photoresist.

The plurality of buffer chambers 3800 are provided. Some of the buffer chambers 3800 are disposed between the index module 20 and the transfer chamber 3400. Hereinafter, these buffer chambers are referred to as the front buffers 3802. The front buffers 3802 are stacked on each other along the up-down direction. The other buffer chambers 3800 are disposed between the transfer chamber 3400 and the interface module 40. These buffer chambers are referred to as the rear buffers 3804. The rear buffers 3804 are stacked on each other along the up-down direction. Each of the front buffers 3802 and the rear buffers 3804 temporarily stores a plurality of substrates W. The substrates W stored in the front buffers 3802 are loaded or unloaded by the index robot 2200 and the transfer robot 3422. The substrates W stored in the rear buffers 3804 are loaded or unloaded by the transfer robot 3422 and a first robot 4602.

Each of the developing blocks 30b has heat treatment chambers 3200, a transfer chamber 3400, and liquid treatment chambers 3600. The heat treatment chambers 3200, the transfer chamber 3400, and the liquid treating chambers 3600 of the developing block 30b are provided in a structure and an arrangement substantially similar to the structure and the arrangement in which the heat treatment chambers 3200, the transfer chamber 3400, and the liquid treating chambers 3600 of the coating block 30a are provided, and therefore detailed descriptions thereabout will be omitted. However, the liquid treatment chambers 3600 in the developing block 30b are implemented with developing chambers 3600, all of which identically dispense a developing solution to perform a developing process on the substrate W.

The interface module 40 connects the treating module 30 with an external exposing apparatus 50. The interface module 40 has an interface frame 4100, an additional process chamber 4200, an interface buffer 4400, and a transfer member 4600.

The interface frame 4100 may have, at the top thereof, a fan filter unit that forms a downward air flow in the interface frame 4100. The additional process chamber 4200, the interface buffer 4400, and the transfer member 4600 are disposed in the interface frame 4100. Before the substrate W completely treated in the coating block 30a is transferred to the exposing apparatus 50, the additional process chamber 4200 may perform a predetermined additional process on the substrate W. Selectively, before the substrate W completely treated in the exposing apparatus 50 is transferred to the developing block 30b, the additional process chamber 4200 may perform a predetermined additional process on the substrate W. According to an embodiment, the additional process may be an edge exposing process of exposing the edge region of the substrate W to light, a top-side cleaning process of cleaning the top side of the substrate W, or a backside cleaning process of cleaning the backside of the substrate W. A plurality of additional process chambers 4200 may be provided. The additional process chambers 4200 may be stacked one above another. The additional process chambers 4200 may all perform the same process. Selectively, some of the additional process chambers 4200 may perform different processes.

The interface buffer 4400 provides a space in which the substrate W transferred between the coating block 30a, the additional process chambers 4200, the exposing apparatus 50, and the developing block 30b temporarily stays. A plurality of interface buffers 4400 may be provided. The interface buffers 4400 may be stacked one above another.

According to an embodiment, the additional process chambers 4200 may be disposed on one side of an extension line facing in the lengthwise direction of the transfer chamber 3400, and the interface buffers 4400 may be disposed on an opposite side of the extension line.

The transfer member 4600 transfers the substrate W between the coating block 30a, the additional process chambers 4200, the exposing apparatus 50, and the developing block 30b. The transfer member 4600 may be implemented with one or more robots. According to an embodiment, the transfer member 4600 has the first robot 4602 and a second robot 4606. The first robot 4602 may transfer the substrate W between the coating block 30a, the additional process chambers 4200, and the interface buffers 4400. An interface robot 4606 may transfer the substrate W between the interface buffers 4400 and the exposing apparatus 50. The second robot 4606 may transfer the substrate W between the interface buffers 4400 and the developing block 30b.

The first robot 4602 and the second robot 4606 each include a hand on which the substrate W is placed, and the hand is movable forward and backward, rotatable about an axis parallel to the third direction 16, and movable along the third direction 16.

The hands of the index robot 2200, the first robot 4602, and the second robot 4606 may all have the same shape as the hand 3420 of the transfer robot 3422. Selectively, a hand of a robot that directly exchanges the substrate W with the transfer plate 3240 of each heat treatment chamber 3200 may have the same shape as the hand 3420 of the transfer robot 3422, and hands of the remaining robots may have a different shape from the hand 3420 of the transfer robot 3422.

According to an embodiment, the index robot 2200 may directly exchange the substrate W with the heating unit 3230 of the front heat treatment chamber 3200 provided in the coating block 30a.

Furthermore, the transfer robots 3422 provided in the coating block 30a and the developing block 30b may directly exchange the substrate W with the transfer plate 3240 located in the heat treatment chamber 3200.

As described above, according to the embodiments of the inventive concept, the substrate treating apparatus and method may adjust the thickness of a liquid film formed on a central region of a substrate.

Effects of the inventive concept are not limited to the aforementioned effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:
1. An apparatus for treating a substrate, the apparatus comprising:
 a process chamber having a process space inside;
 a support unit configured to support the substrate in the process space;

a heating unit inside the support unit and configured to heat the substrate;

an exhaust unit configured to evacuate the process space;

a gas supply unit configured to supply a gas into the process space; and a controller, wherein the gas supply unit includes a first supply unit and a second supply unit, and the gas supply unit is configured to supply the gas having a temperature determined based on a thickness of a liquid film on the substrate in the process space, wherein the first supply unit includes a first supply tube configured to directly supply the gas at a first temperature into the process space, wherein the second supply unit includes,
- a second supply tube configured to supply the gas,
- a buffer space being above the support unit and configured to receive the gas through the second supply tube,
- a heater configured to heat the gas in the buffer space,
- a dispensing space vertically between the buffer space and the support unit and fluidically connected to the buffer space, the dispensing space configured to receive the heated gas from the buffer space, and provide the heated gas as the gas of a second temperature to the process space, and
- a partitioning plate configured to partition an interior space of the second supply unit into the buffer space and the dispensing space, wherein the controller is configured to control the first and second supply units based on the thickness of the liquid film on the substrate in the process space, wherein the partitioning plate is spaced apart from an upper body of the process chamber, wherein the exhaust unit includes a plurality of exhaust holes, and wherein the least one exhaust hole of the plurality of exhaust holes is arranged in the upper body of the process chamber and is upwardly spaced apart from the partitioning plate.

2. The apparatus of claim 1, wherein the first supply unit is configured to pass the gas through the buffer space and the dispensing space.

3. The apparatus of claim 1, wherein
the partitioning plate having a first hole formed therein,
a dispensing plate having a second hole formed therein for dispensing the gas in the dispensing space into the process space, and
the partitioning plate faces a central region of the substrate, and the dispensing plate faces an entire region of the substrate.

4. The apparatus of claim 1, wherein dispensing openings of the first supply unit and the second supply unit face a central region of the substrate.

5. The apparatus of claim 1, wherein the gas supply unit includes:
a measurement device configured to measure the thickness of the liquid film formed on the substrate; and
the controller is configured to receive the thickness of the liquid film on the substrate that is measured by the measurement device.

6. The apparatus of claim 5, wherein
based on the thickness of the liquid film on the substrate that is measured by the measurement device, the controller is configured to
supply the gas at the second temperature when the thickness of the liquid film formed on a central region of the substrate is greater than or equal to a value, and
supply the gas at the first temperature when the thickness of the liquid film formed on the central region of the substrate is smaller than the value, and
the controller is further configured to control the gas supply unit to continually supply the gas until the thickness of the liquid film on the central region of the substrate reaches the value.

7. The apparatus of claim 5, wherein
based on the thickness of the liquid film on the substrate that is measured by the measurement device, the controller is configured to supply the gas at the second temperature when the thickness of the liquid film formed on a central region of the substrate is greater than or equal to a value, and
the controller is further configured to control the gas supply unit to increase a flow rate of the gas as the thickness of the liquid film on the central region of the substrate is increased and to continually supply the gas until the thickness of the liquid film formed on the central region of the substrate reaches the value.

* * * * *